(12) United States Patent
Edmond et al.

(10) Patent No.: US 6,952,024 B2
(45) Date of Patent: Oct. 4, 2005

(54) GROUP III NITRIDE LED WITH SILICON CARBIDE CLADDING LAYER

(75) Inventors: John Adam Edmond, Cary, NC (US); Kathleen Marie Doverspike, Apex, NC (US); Hua-Shuang Kong, Raleigh, NC (US); Michael John Bergmann, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/365,901

(22) Filed: Feb. 13, 2003

(65) Prior Publication Data

US 2004/0159842 A1 Aug. 19, 2004

(51) Int. Cl.[7] .............................................. H01L 33/00
(52) U.S. Cl. ......................... 257/97; 257/201; 257/96; 257/103
(58) Field of Search ........................ 257/97, 103, 96, 257/201

(56) References Cited

U.S. PATENT DOCUMENTS

| | | |
|---|---|---|
| 4,865,685 A | 9/1989 | Palmour |
| 4,866,005 A | 9/1989 | Davis et al. |
| 4,912,063 A | 3/1990 | Davis et al. |
| 4,912,064 A | 3/1990 | Kong et al. |
| 4,918,497 A | 4/1990 | Edmond |
| 4,946,547 A | 8/1990 | Palmour et al. |
| 4,981,551 A | 1/1991 | Palmour |
| 5,011,549 A | 4/1991 | Kong et al. |
| 5,027,168 A | 6/1991 | Edmond |
| 5,087,576 A | 2/1992 | Edmond et al. |
| 5,119,540 A | 6/1992 | Kong et al. |
| 5,338,944 A | 8/1994 | Edmond et al. |
| 5,393,993 A * | 2/1995 | Edmond et al. ............... 257/77 |
| 5,670,798 A * | 9/1997 | Schetzina .................... 257/96 |
| 6,051,849 A | 4/2000 | Davis et al. |
| 6,063,186 A | 5/2000 | Irvine et al. |
| 6,117,688 A | 9/2000 | Evans, Jr. et al. |
| 6,162,656 A * | 12/2000 | Kunisato et al. ............... 438/46 |
| 6,265,289 B1 | 7/2001 | Zheleva et al. |
| 6,459,100 B1 | 10/2002 | Doverspike et al. |
| 6,582,986 B2 | 6/2003 | Kong et al. |
| 6,608,327 B1 | 8/2003 | Davis et al. |

FOREIGN PATENT DOCUMENTS

| | | | |
|---|---|---|---|
| EP | 0 622 858 A2 | 11/1994 | |
| JP | 08-64910 | * 3/1996 | ............. H01S/3/18 |

OTHER PUBLICATIONS

Korakakis et al., "Growth and doping of GaN directly on 6H–SiC by MBE," Materials Research Society Symposium Proceedings, vol. 395: GaN and Related Materials, 1996, pp. 151–155.*

Jeon et al.; Lateral current spreading in GaN–based light-emitting diodes utilizing tunnel contact junctions; Applied Physics Letters, vol. 78, No. 21; May 21, 2001; pp. 3265–3267; American Institute of Physics.

Sheu et al.; Low–Operation Voltage of InGaN/GaN Light-Emitting Diodes with Si–Doped In(0.3) Ga(0.7) N/GaN Short–Period Superlattice Tunneling Contact Layer; IEEE Electron Device Letters; vol. 22, No. 10; Oct. 2001.

* cited by examiner

Primary Examiner—Jerome Jackson
(74) Attorney, Agent, or Firm—Summa & Allan, P.A.

(57) ABSTRACT

A semiconductor structure for light emitting devices includes a Group III nitride active layer positioned between a silicon carbide cladding layer and a Group III nitride cladding layer, wherein the silicon carbide cladding layer and the Group III nitride cladding layer have opposite conductivity types. Moreover, the silicon carbide cladding layer and the Group III nitride cladding layer have respective bandgaps that are larger than the bandgap of the active layer.

17 Claims, 2 Drawing Sheets

US 6,952,024 B2

GROUP III NITRIDE LED WITH SILICON CARBIDE CLADDING LAYER

RELATED APPLICATIONS

This application incorporates entirely by reference co-pending and commonly-assigned applications Ser. No. 09/706,057 (Group III Nitride Light Emitting Devices with Gallium-Free Layers), Ser. No. 09/760,635 (Group III Nitride LED with Undoped Cladding Layer), and Ser. No. 10/366,053 (Group III Nitride Contact Structures for Light Emitting Devices).

FIELD OF THE INVENTION

The present invention relates to semiconductor structures of light emitting devices, particularly light emitting diodes and laser diodes formed from Group III nitrides, which are capable of emitting light in the red to ultraviolet portions of the electromagnetic spectrum.

BACKGROUND OF THE INVENTION

Photonic semiconductor devices fall into three categories: devices that convert electrical energy into optical radiation (e.g., light emitting diodes and laser diodes); devices that detect optical signals (e.g., photodetectors); and devices that convert optical radiation into electrical energy (e.g., photovoltaic devices and solar cells). Although all three kinds of devices have useful applications, the light emitting diode may be the most commonly recognized because of its application to various consumer products and applications.

Light emitting devices (e.g., light emitting diodes and laser diodes), herein referred to as LEDs, are photonic, p-n junction semiconductor devices that convert electrical power into emitted light. Perhaps most commonly, LEDs form the light source in the visible portion of the electromagnetic spectrum for various signals, indicators, gauges, and displays used in many consumer products (e.g., audio systems, automobiles, household electronics, and computer systems). LEDs are desirable as light output devices because of their generally long lifetime, their low power requirements, and their high reliability.

Despite widespread use, LEDs are somewhat functionally constrained, because the color that a given LED can produce is limited by the nature of the semiconductor material used to fabricate the LED. As well known to those of ordinary skill in this and related arts, the process by which light is generated in an LED is referred to as "electroluminescence," which refers to the generation of light by passing an electric current through a material under an applied voltage. Any particular composition that produces electroluminescent light tends to do so over a relatively narrow range of wavelengths.

The wavelength of light (i.e., the color) that can be emitted by a given LED material is limited by the physical characteristics of that material, specifically its bandgap energy. Bandgap energy is the amount of energy that separates a lower-energy valence band and a higher energy conduction band in a semiconductor. The bands are energy states in which carriers (i.e., electrons or holes) can reside in accordance with well-known principles of quantum mechanics. The "bandgap" is a range of energy between the conduction and valence bands that is forbidden to the carriers (i.e., the carriers cannot exist in these energy states). Under certain circumstances, when an electron from the conduction band crosses the bandgap and recombines with a hole in the valence band, a quantum of energy is released in the form of light. The frequency of the emitted light is proportional to the energy released during the recombination. In other words, the frequency of electromagnetic radiation (i.e., the color) that can be produced by a given semiconductor material is a function of the material's bandgap energy.

In this regard, narrower bandgaps produce lower energy, longer wavelength photons. Conversely, wider bandgap materials produce higher energy, shorter wavelength photons. Blue light has a shorter wavelength—and thus a higher frequency—than the other colors in the visible spectrum. Consequently, blue light must be produced from transitions that are greater in energy than those transitions that produce green, yellow, orange, or red light. Producing photons that have wavelengths in the blue or ultraviolet portions of the electromagnetic spectrum requires semiconductor materials that have relatively large bandgaps.

The entire visible spectrum runs from the violet at or about 390 nanometers to the red at about 780 nanometers. In turn, the blue portion of the visible spectrum can be considered to extend between the wavelengths of about 425 and 480 nanometers. The wavelengths of about 425 nanometers (near violet) and 480 nanometers (near green) in turn represent energy transitions of about 2.9 eV and about 2.6 eV, respectively. Accordingly, only a material with a bandgap of at least about 2.6 eV can produce blue light.

Shorter wavelength devices offer a number of advantages in addition to color. In particular, when used in optical storage and memory devices, such as CD-ROM optical disks, shorter wavelengths enable such storage devices to hold significantly more information. For example, an optical device storing information using blue light can hold substantially more information in the same space as one using red light.

The basic mechanisms by which light-emitting diodes operate are well understood in this art and are set forth, for example, by Sze, *Physics of Semiconductor Devices*, 2d Edition (1981) at pages 681–703.

The common assignee of the present patent application was the first in this field to successfully develop commercially viable LEDs that emitted light in the blue color spectrum and that were available in commercial quantities. These LEDs were formed in silicon carbide, a wide-bandgap semiconductor material. Examples of such blue LEDs are described in U.S. Pat. Nos. 4,918,497 and 5,027,168 to Edmond each titled "Blue Light Emitting Diode Formed in Silicon Carbide." Other examples of Group III nitride LED structures and laser structures are described in commonly assigned U.S. Pat. Nos. 5,523,589; 5,592,501; and 5,739,554.

In addition to silicon carbide, candidate materials for blue light emitting devices are gallium nitride (GaN) and its associated Group III (i.e., Group III of the periodic table) nitride compounds such as aluminum gallium nitride (AlGaN), indium gallium nitride (InGaN), and in some circumstances aluminum indium gallium nitride (AlInGaN). These materials are particularly attractive because they offer direct energy transitions with bandgaps between about 1.9 to about 6.2 eV at room temperature. More common semiconductor materials such as silicon, gallium phosphide, or gallium arsenide are unsuitable for producing blue light because their bandgaps are approximately 2.26 eV or less, and in the case of silicon, are indirect semiconductors and inefficient light emitters.

As known to those familiar with LEDs and electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the device.

Generally speaking, an LED formed in a direct bandgap material will perform more efficiently than one formed in an indirect bandgap material. Therefore, the direct transition characteristics of Group III nitrides offer the potential for brighter and more efficient emissions—and thus brighter and more efficient LEDs—than do the emissions from indirect materials such as silicon carbide. Accordingly, much interest in the last decade has also focused on producing light emitting diodes in gallium nitride and related Group III nitrides.

Although Group III nitrides offer a direct transition over a wide bandgap energy range, the material presents a particular set of technical manufacturing problems. In particular, no commercially-viable technique has yet emerged for producing bulk single crystals of gallium nitride (GaN) that are capable of functioning as appropriate substrates for the gallium nitride epitaxial layers on which photonic devices would be formed.

All semiconductor devices require some kind of structural substrate. Typically, a substrate formed of the same material as the active region offers significant advantages, particularly in crystal growth and lattice matching. Because gallium nitride has yet to be formed in such bulk crystals, gallium nitride photonic devices must be formed in epitaxial layers on non-GaN substrates.

Recent work in the field of Group III nitride substrates includes copending and commonly assigned U.S. Pat. No. 6,296,956, issued Oct. 2, 2001 for "Growth of Bulk Single Crystals of Aluminum Nitride;" U.S. Pat. No. 6,066,205 issued May 23, 2000 for "Growth of Bulk Single Crystals of Aluminum Nitride from a Melt;" U.S. Pat. No. 6,045,612 issued Apr. 4, 2000 for "Growth of Bulk Single Crystals of Aluminum Nitride;" and U.S. Pat. No. 6,086,072 issued Jul. 11, 2000 for "Growth of Bulk Single Crystals of Aluminum Nitride: Silicon Carbide Alloys."

Using different substrates, however, causes an additional set of problems, mostly in the area of crystal lattice matching. In nearly all cases, different materials have different crystal lattice parameters. As a result, when a gallium nitride epitaxial layer is grown on a different substrate, some crystal lattice mismatching and thermal expansion coefficient mismatching will occur. The resulting epitaxial layer is referred to as being "strained" by this mismatch. Crystal lattice mismatches, and the strain they produce, introduce the potential for crystal defects. This, in turn, affects the electronic characteristics of the crystals and the junctions, and thus tends to degrade the performance of the photonic device. These kinds of defects are even more problematic in high power structures.

In many Group III nitride LEDs, the most common substrate for gallium nitride devices has been sapphire (i.e., aluminum oxide $Al_2O_3$). Certain contemporary Group III nitride devices continue to use it.

Sapphire is optically transparent in the visible and ultraviolet ranges, but has a crystal lattice mismatch with gallium nitride of about 16 percent. Furthermore, sapphire is insulating rather than conductive, and is unsuitable for conductivity doping. Consequently, the electric current that must be passed through an LED to generate the light emission cannot be directed through a sapphire substrate. Thus, other types of connections to the LED must be made.

In general, LEDs with vertical geometry use conductive substrates so that ohmic contacts can be placed at opposite ends of the device. Such vertical LEDs are preferred for a number of reasons, including their easier manufacture and more simple incorporation into end-use devices than non-vertical devices. In the absence of a conductive substrate, however, vertical devices cannot be formed.

In contrast with sapphire, Gallium nitride only has a lattice mismatch of about 2.4 percent with aluminum nitride (AlN) and mismatch of about 3.5 percent with silicon carbide. Silicon carbide has a somewhat lesser mismatch of only about 1 percent with aluminum nitride.

Group III ternary and quaternary nitrides (e.g., indium gallium nitride and aluminum indium gallium nitride) have also been shown to have relatively wide bandgaps. Accordingly, such Group III nitrides also offer the potential for blue and ultraviolet semiconductor lasers and LEDs. Most of these compounds, however, present the same problems as gallium nitride, namely the lack of an identical single crystal substrate. Thus, each is typically used in the form of epitaxial layers grown on different substrates. This presents the same potential for crystal defects and associated electronic problems.

Accordingly, the assignee of the present invention has developed the use of silicon carbide substrates for gallium nitride and other Group III devices as a means of solving the conductivity problems of sapphire as a substrate. Because silicon carbide can be doped conductively, vertical LEDs can be formed. As noted, a vertical structure facilitates both the manufacture of LEDs and their incorporation into circuits and end-use devices.

As known to those familiar with Group III nitrides, their properties differ based on the identity and mole fraction of the present Group III elements (e.g., gallium, aluminum, indium). For example, increasing the mole fraction of aluminum tends to increase the bandgap, while decreasing the amount of aluminum tends to increase the refractive index. Similarly, a larger proportion of indium will decrease the bandgap of the material, thus permitting the bandgap to be adjusted or "tuned" to produce photons of desired frequencies. This, however, tends to reduce the chemical and physical stability of the crystal. Other effects based on mole fraction include changes in crystal lattice spacing resulting in strain effects.

Accordingly, and despite much effort in this area, a need still exists for devices that incorporate vertical geometry, and that take advantage of the characteristics that result when the proportions of indium, aluminum, and gallium are desirably adjusted in the active layers and cladding layers of Group III nitride photonic devices.

OBJECT AND SUMMARY OF THE INVENTION

Therefore, it is an object of the present invention to produce light emitting devices from Group III nitrides in a manner that takes advantage of their favorable properties, and yet offers significant, cost-effective manufacturing advantages that will increase the availability of such devices.

Accordingly, the present invention is a semiconductor structure for light emitting devices that can emit in the red to ultraviolet portion of the electromagnetic spectrum. The semiconductor structure includes a Group III nitride active layer positioned between a silicon carbide cladding layer and a Group III nitride cladding layer, wherein the silicon carbide cladding layer and the Group III nitride cladding layer have opposite conductivity types. Moreover, the silicon carbide cladding layer and the Group III nitride cladding layer have respective bandgaps that are larger than the bandgap of the active layer.

The foregoing, as well as other objectives and advantages of the invention and the manner in which the same are accomplished, is further specified within the following detailed description and its accompanying drawings.

DETAILED DESCRIPTION

The present invention is a semiconductor structure for light emitting devices that can emit in the red to ultraviolet portion of the electromagnetic spectrum. The structure includes a Group III nitride active layer positioned between a silicon carbide cladding layer and a Group III nitride cladding layer. These cladding layers, which have opposite conductivity types from one another, possess respective bandgaps that are each larger than the bandgap of the active layer.

A particular conductivity type, (i.e., n-type or p-type), may be inherent, but is more commonly a result of specifically doping the Group III nitrides using the appropriate donor or acceptor atoms. In this regard, and is known by those familiar with light emitting devices, including structural layers of opposite conductivity types facilitates forwarding biasing of the device, which in turn promotes the recombinations that produce the desired emissions. Appropriate doping of Group III nitrides is well understood in the art and will not be further discussed herein other than as necessary to describe the invention.

As will be understood by those having ordinary skill in the art, the molar fraction of aluminum, indium, and gallium in Group III nitride layers may be generally expressed by the formula, $Al_xIn_yGa_{1-x-y}N$, where $0 \leq x \leq 1$ and $0 \leq y \leq 1$ and $(x+y) \leq 1$. In this regard it will be further understood that the relative concentrations of aluminum, indium, and gallium may vary from layer to layer. Moreover, as used herein, the term "layer" generally refers to a single crystal epitaxial layer.

Figure 1:
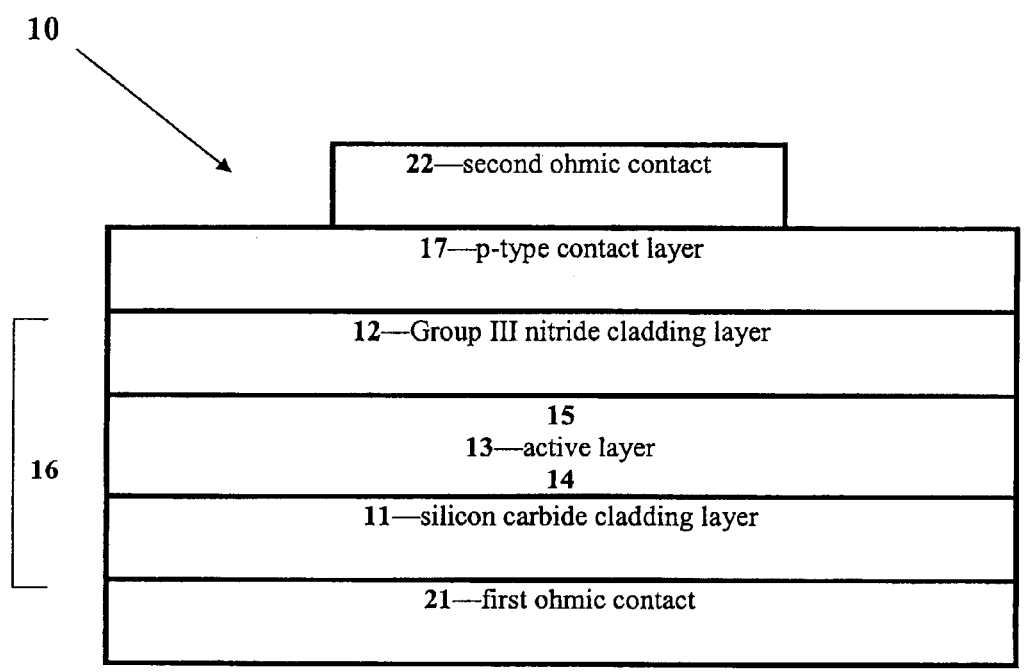
FIG. 1 is a cross-sectional schematic view of the aspects of a semiconductor structure for a light-emitting device according to the present invention.

An understanding of the invention may be achieved with reference to FIG. 1, which is a cross-sectional schematic view of a basic semiconductor structure for a light-emitting device according to the present invention. The semiconductor structure, which is generally designated at 10, includes a silicon carbide cladding layer 11, which preferably has a polytype of 2H, 3C, 4H, 6H, or 15R.

Most preferably, the silicon carbide cladding layer 11 is a single crystal. As is well understood by those of ordinary skill in this art, a high-quality single crystal provides a number of structural advantages that in turn provide significant performance and lifetime advantages. Single crystals of silicon carbide can be formed by the methods described in U.S. Pat No. 4,866,005 (now U.S. Pat. No. RE 34,861), which is commonly assigned with this application. Preferably, the silicon carbide cladding layer 11 is n-type because high-quality, silicon carbide single crystals have been somewhat easier to produce as n-type.

The silicon carbide cladding layer 11 may be a silicon carbide substrate or, alternatively, a silicon carbide epitaxial layer. In a preferred embodiment, the silicon carbide cladding layer 11 includes an epitaxial layer on a silicon carbide substrate.

The semiconductor structure 10 also includes a Group III nitride cladding layer 12 of $Al_xIn_yGa_{1-x-y}N$ where $0 \leq x \leq 1$ and $0 \leq y \leq 1$ and $(x+y) \leq 1$, which has a conductivity type opposite that of the silicon carbide cladding layer 11.

An active layer 13 having the formula $Al_xIn_yGa_{1-x-y}N$, where $0 \leq x \leq 1$ and $0 \leq y \leq 1$ and $(x+y) \leq 1$, is positioned between the silicon carbide cladding layer 11 and Group III nitride cladding layer 12. The range of the variable y in the formula $Al_xIn_yGa_{1-x-y}N$ most preferably excludes 0 (i.e., $0 < y \leq 1$), which will be understood by those skilled in the art as requiring the presence of indium in the active layer 13. Indium promotes the emission of radiation in the visible portion of the electromagnetic spectrum, most preferably in the blue to violet regions.

The active layer 13 may be either doped or undoped. When doped, the active layer 13 preferably has the same conductivity type (i.e., p-type or n-type) as that possessed by the silicon carbide cladding layer 11. Moreover, the active layer 13 and the associated cladding layers may comprise a double heterostructure, a single quantum well or a multiple quantum well. The nature and operation of heterostructures and quantum wells in such devices, as well as the bandgap and thickness requirements for cladding layers in such structures, is generally well understood in this art and will not be otherwise explained in detail.

Finally, as previously noted, the bandgap of the active layer 13 is smaller than each of the respective bandgaps possessed by the silicon carbide cladding layer 11 and the Group III nitride cladding layer 12.

The recited variables (e.g., x and y) refer to the structural layer they describe. That is, the value of a variable with respect to one layer is immaterial to the value of the variable with respect to another layer. For example, in describing the semiconductor structure 10, the variable x may have one value with respect to Group III nitride cladding layer 12 and another value with respect to the active layer 13. As will also be understood by those of ordinary skill in the art, the limitation $0 \leq (x+y) \leq 1$ with respect to the expression $Al_xIn_yGa_{1-x-y}N$ simply requires that the Group III elements and the nitride be present in a 1:1 molar ratio.

As used herein, the concept of one layer being "between" two other layers does not necessarily imply that the three layers are contiguous (i.e., in intimate contact). Rather, as used herein the concept of one layer being between two other layers is meant to describe the relative positions of the layers within the semiconductor structure. Similarly, as used herein, the concept of a first layer being in contact with a second layer, "opposite" a third layer, merely describes the relative positions of the first and second layers within the semiconductor structure.

That said, in preferred embodiments of the semiconductor structure, the active layer 13 has a first surface 14 contiguous to the silicon carbide cladding layer 11 and a second surface 15 contiguous to the Group III nitride cladding layer 12. In other words, in such embodiments, the active layer 13 is sandwiched directly between the silicon carbide cladding layer 11 and the Group III nitride cladding layer 12, with no additional layers disturbing this three-layer double heterostructure, which is designated by the brackets 16.

The structural designation "double heterostructure" is used in a manner well understood in this art. Aspects of these structures are discussed, for example, in Sze, *Physics of Semiconductor Devices*, Second Edition (1981) at pages 708–710. Although the cited Sze discussion refers to lasers, it nonetheless illustrates the nature of, and the distinction between, homostructure, single heterostructure, and double heterostructure devices.

In another embodiment the semiconductor structure 10 can include a p-type contact layer 17 that is positioned in the semiconductor structure 10 such that the Group III nitride cladding layer 12 is between the p-type contact layer 17 and the active layer 13. Typically, the p-type contact layer 17 is in contact the Group III nitride cladding layer 12, opposite the active layer 13.

In preferred embodiments, the p-type contact layer 17 is made of gallium nitride(preferably magnesium-doped gallium nitride); indium nitride; aluminum indium nitride of the formula $Al_xIn_{1-x}N$, where $0<x<1$; aluminum gallium nitride of the formula $Al_xGa_{1-x}N$, where $0<x<1$, $In_xGa_{1-x}N$, where $0<x<1$; or $Al_xIn_yGa_{1-x-y}N$, where $0<x<1$ and $0<y<1$ and $(x+y)<1$. In this regard, the exclusion of both 0 and 1 from the range requires the presence of both Group III elements in the alloy.

In a most preferred embodiment, the p-type contact layer 17 comprises a superlattice formed from a plurality of Group III nitride layers selected from the group consisting of gallium nitride (preferably magnesium-doped gallium nitride); indium nitride; aluminum indium nitride of the formula $Al_xIn_{1-x}N$, where $0<x<1$; $Al_xGa_{1-x}N$, where $0<x<1$; $AL_xGA_{1-x}N$, where $0<x<1$;indium gallium nitride of the formula $In_xGa_{1-x}N$, where $0<x<1$; and $Al_xIn_yGa_{1-x-y}N$ where $0<x<1$ and $0<y<1$ and$(x+y)<1$.

In particular, the superlattice is best formed from alternating layers of any two of these Group III nitride layers. In such a superlattice, alternating layers of any two of gallium nitride, aluminum indium nitride, an indium gallium nitride are most preferred More generally, it is preferable to incorporate in the superlattice structure at least one layer of indium nitride, aluminum indium nitride, indium gallium nitride, or aluminum indium gallium nitride (i.e., the superlattice should not be formed from only gallium nitride layers). Aluminum gallium nitride layers are somewhat less favored. For example, a superlattice formed from a plurality of contiguous p-type Group III nitride layers selected from the group consisting of gallium nitride, aluminum indium nitride, indium gallium nitride is especially desirable, provided at least one contiguous p-type Group III nitride layer is either aluminum indium nitride or indium gallium nitride.

The semiconductor structure 10 can further include a first ohmic contact 21 and a second ohmic contact 22. As indicated in FIG. 1, the first ohmic contact 21 is positioned in the semiconductor structure 10 such that the silicon carbide cladding layer 11 is between the first ohmic contact 21 and the active layer 13. The second ohmic contact 22 is positioned in the semiconductor structure such that the Group III nitride cladding layer 12 is between the second ohmic contact 22 and the active layer 13.

Preferably, the first ohmic contact 21 is placed directly on the silicon carbide cladding layer 11, opposite the active layer 13, and the second ohmic contact 22 is placed directly on the Group III nitride cladding layer 12, opposite the active layer. In a variant of this embodiment, however, where the p-type contact layer 17 is present, the p-type contact layer 17 is positioned between the second ohmic contact 22 and the Group III nitride cladding layer 12, preferably with no intervening layers.

The ohmic contacts 21 and 22, which complete the advantageous vertical structure of the invention, are preferably formed of a metal such as aluminum (Al), nickel (Ni), titanium (Ti), gold (Au), platinum (Pt), vanadium (V), alloys, or blends thereof, or sequential layers of two or more of these metals, but also may be formed of other ohmic contact materials known by those skilled in the art provided that they exhibit ohmic character and do not otherwise interfere with the structure or function of the light-emitting device 10.

To the extent the ohmic contact 21 is formed to the silicon carbide cladding layer 11, the invention is distinguished from those devices that employ sapphire. Sapphire cannot be made conductive, and so cannot be connected to an ohmic contact. Consequently, sapphire-based devices cannot be formed into the kinds of vertical structures that are most preferred for LEDs.

In a preferred embodiment of the semiconductor structure 10, the silicon carbide cladding layer 11 consists essentially of an epitaxial layer of silicon carbide on a silicon carbide substrate (i.e., the epitaxial layer is in contact with the substrate). The active layer 13, has the formula $Al_xIn_yGa_{1-x-y}N$, where $0\leq x \leq 1$ and $0<y\leq 1$ and $(x+y)\leq 1$, and is in contact with the epitaxial layer of the silicon carbide cladding layer 11. The Group III nitride cladding layer 12 has the formula $Al_xIn_yGa_{1-x-y}N$ where $0\leq x \leq 1$ and $0\leq y \leq 1$ and $(x+y)\leq 1$, and is in contact with the active layer 13, opposite the silicon carbide cladding layer 11.

Moreover, as disclosed previously, the silicon carbide cladding layer 11 and the Group III nitride cladding layer 12 have opposite conductivity types, and the silicon carbide cladding layer 11 and the Group III nitride cladding layer 12 have respective bandgaps that are larger than the bandgap of the active layer 13.

The silicon carbide substrate and epitaxial layer, which together form the silicon carbide cladding layer 11, typically have the same polytype, namely 2H, 3C, 4H, 6H, and 15R. For a number of reasons, including ease of manufacturing, favored operation of the device, and chemical and electrical tendencies of the material, the silicon carbide substrate and the silicon carbide epitaxial layer are preferably n-type, and the Group III nitride cladding layer 12 is p-type.

As is known to those of ordinary skill in this art, the composition of ternary and quaternary Group III nitrides can affect both their refractive indices and bandgaps. In general, a larger proportion of aluminum increases bandgap and decreases refractive index.

Figure 2:
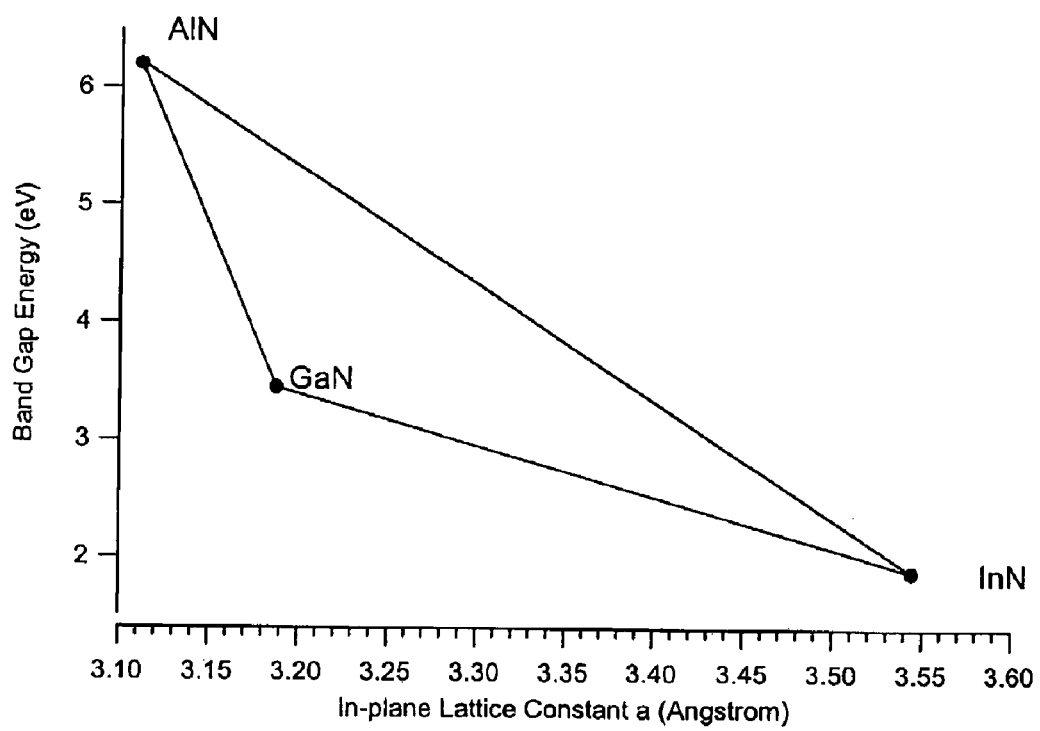
FIG. 2 is a theoretical plot of bandgap energy versus lattice parameter for Group III nitrides alloys of aluminum, indium, and gallium.

For example, FIG. 2 theoretically describes bandgap energy versus lattice parameter. The triangular region of FIG. 1 represents the range of bandgap energies available for Group III nitrides of aluminum, indium, and gallium. FIG. 2 reveals that for any particular lattice parameter, eliminating gallium maximizes the bandgap energy (i.e., the bandgap for an aluminum indium nitride is defined by the AlN—InN segment).

To enhance the capabilities of a semiconductor device, the active layer should desirably have a lower bandgap than the adjacent cladding layers, and a higher refractive index than the adjacent cladding layers. Such a structure gives two benefits that are especially important for laser capability. First, if the active layer has the lowest bandgap, it forms a quantum well into which carriers tend to fall. This helps to enhance the laser effect. Second, waveguiding occurs in the material that has the highest refractive index in the structure. Accordingly, when the bandgap of the active layer is less than that of the adjacent layers and its refractive index is greater than that of the adjacent layers, the lasing capabilities of the device are enhanced.

Accordingly, the mole fraction of aluminum in the Group III nitride cladding layer 12 is preferably greater than the mole fraction of aluminum in the active layer 13. More preferably still, the refractive index of the active layer 13 is greater than the respective refractive indices of the silicon carbide cladding layer 11 and the Group III nitride cladding layer 12. The larger bandgap of the cladding layers 11 and 12 encourages carriers to be confined in the active layer 13, thereby increasing the efficiency of the device. Similarly, the lower refractive index of the heterostructure layers 11 and 12 encourages the light to be more preferably emitted optically from the active layer 13.

In yet another embodiment of the semiconductor structure 10, the n-type cladding layer 11 consists essentially of silicon carbide of a polytype selected from the group consisting of 2H, 3C, 4H, 6H, and 15R; the p-type Group III nitride cladding layer 12 has the formula $Al_xIn_yGa_{1-x-y}N$ where $0 \leq x \leq 1$ and $0 \leq y \leq 1$ and $(x+y) \leq 1$; and the active layer 13 has the formula $Al_xIn_yGa_{1-x-y}N$, where $0 \leq x \leq 1$ and $0 < y \leq 1$ and $(x+y) \leq 1$, is capable of emitting radiation in the visible portion of the electromagnetic spectrum, and is positioned between the silicon carbide cladding layer and the Group III nitride cladding layer. Preferably, the active layer 13 is sandwiched directly between the silicon carbide cladding layer 11 and the Group III nitride cladding layer 12, with no additional layers disturbing the three-layer double heterostructure 16.

As in other embodiments, the silicon carbide cladding layer 11 and the Group III nitride cladding layer 12 have respective bandgaps that are larger than the bandgap of the active layer 13. Moreover, the mole fraction of aluminum in the Group III nitride cladding layer 12 is greater than the mole fraction of aluminum in the active layer 13, and the refractive index of the active layer 13 is greater than the respective refractive indices of the silicon carbide cladding layer 11 and the Group III nitride cladding layer 12.

The semiconductor structure may be further refined by more closely matching the respective crystal lattices of contiguous layers. As will be understood by those of skill in the art, this does not imply perfect matching, but rather that a layer has been progressively doped so that its lattice at a layer interface is more compatible with the crystal lattice of the adjacent layer. When fabricating devices, a number of considerations must be balanced. One such consideration is lattice matching. If other factors are more important, a perfect or close lattice match may be less important, and vice versa.

For example, cladding layers—especially aluminum indium nitride n-type cladding layers—can be selectively lattice matched to gallium-containing active layers, especially gallium nitride and indium gallium nitride active layers, in order to reduce strain and defects. In particular, aluminum indium nitrides are useful because they can be lattice matched to other Group III nitrides at higher bandgap. See FIG. 2.

As will be further understood by those having ordinary skill in the art, lattice matching of the cladding layers and the active layer can be a one-sided lattice match (i.e., where a lattice match occurs on one side of the active layer) or a two-sided lattice match (i.e., where a lattice match occurs on both sides of the active layer).

In the drawing and the specification, exemplary embodiments of the invention have been disclosed. Specific terms have been used only in a generic and descriptive sense, and not for purposes of limitation. The scope of the invention is set forth in the following claims.

That which is claimed is:

1. A light emitting device comprising:
   a silicon carbide substrate;
   a cladding layer consisting essentially of an epitaxial layer of silicon carbide on said substrate;
   a Group III nitride cladding layer of $Al_xIn_yGa_{1-x-y}N$, where $0<x<1$ and $0 \leq y<1$ and $(x+y)<1$;
   an active layer of $Al_xIn_yGa_{1-x-y}N$, where $0 \leq x<1$ and $0<y \leq 1$ and $(x+y) \leq 1$, said active layer having a first surface and a second surface, said first surface of said active layer being in contact with said silicon carbide cladding layer and said second surface of said active layer being in contact with said Group III nitride cladding layer;
   wherein the molar fraction of aluminum in said Group III nitride cladding layer is greater than the molar fraction of aluminum in said active layer;
   wherein said silicon carbide cladding layer and said Group III nitride cladding layer have respective bandgaps that are larger than the bandgap of said active layer; and
   wherein said silicon carbide substrate, said silicon carbide cladding layer, and said active layer are doped layers of the same conductivity type, and said Group III nitride cladding layer is doped to the opposite conductivity type.

2. A light emitting device according to claim 1, wherein said active layer and said cladding layers form a double heterostructure.

3. A light emitting device according to claim 1, wherein said active layer and said cladding layers form a quantum well.

4. A light emitting device according to claim 3 comprising a single quantum well.

5. A light emitting device according to claim 3 comprising a multiple quantum well.

6. A light emitting device according to claim 1, wherein said silicon carbide cladding layer is a single crystal with a polytype selected from the group consisting of 2H, 3C, 4H, 6H, and 15R.

7. A light emitting device according to claim 1, further comprising:
   a first ohmic contact, wherein said silicon carbide cladding layer is positioned between said first ohmic contact and said active layer; and
   a second ohmic contact, wherein said Group III nitride cladding layer is positioned between said second ohmic contact and said active layer.

8. A light emitting device according to claim 7, wherein:
   said first ohmic contact is in contact with said silicon carbide cladding layer, opposite said active layer; and
   said second ohmic contact is in contact with said Group III nitride cladding layer, opposite said active layer.

9. A light emitting device according to claim 7, wherein said first and second ohmic contacts comprise at least one metal selected from the group consisting of aluminum, nickel, titanium, gold, platinum, and vanadium, and layers, alloys, and blends thereof.

10. A light emitting device according to claim 1, further comprising a p-type contact layer of a Group III nitride, wherein said Group III nitride cladding layer is positioned between said p-type contact layer and said active layer.

11. A light emitting device according to claim 10, wherein said p-type contact layer is in contact with said Group III nitride cladding layer, opposite said active layer.

12. A light emitting device according to claim 10, wherein said p-type contact layer is magnesium-doped gallium nitride.

13. A light emitting device according to claim 10, wherein said p-type contact layer is $Al_xIn_{1-x}N$ where $0<x<1$.

14. A light emitting device according to claim 10, wherein said p-type contact layer is $In_xGa_{1-x}N$, where $0<x<1$.

15. A light emitting device according to claim 10, wherein said p-type contact layer is selected from the group consisting of indium nitride, aluminum gallium nitride of the formula $Al_xGa_{1-x}N$, where $0<x<1$, and $Al_xIn_yGa_{1-x-y}N$, where $0<x<1$ and $0<y<1$ and $(x+y)<1$.

16. A light emitting device according to claim 10, wherein said p-type contact layer comprises a superlattice formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

17. A light emitting device according to claim 16, wherein said superlattice is formed from alternating layers of two Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

* * * * *